United States Patent
Joos et al.

(10) Patent No.: US 10,097,172 B2
(45) Date of Patent: Oct. 9, 2018

(54) METHOD FOR PROTECTING A CONTROLLABLE SEMICONDUCTOR SWITCH FROM OVERLOAD AND SHORT-CIRCUITING IN A LOAD CIRCUIT

(71) Applicant: Conti Temic Microelectronic GmbH, Nürnberg (DE)

(72) Inventors: Uli Joos, Nonnenhorn (DE); Alexander Pölzer, Salem (DE); Martin Speckner, Denkendorf (DE); Norbert Stuhler, Ravensburg (DE)

(73) Assignee: Conti Temic microelectronic GmbH, Nürnberg (DE)

( * ) Notice: Subject to any disclaimer, the term of this patent is extended or adjusted under 35 U.S.C. 154(b) by 0 days.

(21) Appl. No.: 14/912,438

(22) PCT Filed: Jul. 31, 2014

(86) PCT No.: PCT/EP2014/066456
§ 371 (c)(1),
(2) Date: Feb. 17, 2016

(87) PCT Pub. No.: WO2015/024754
PCT Pub. Date: Feb. 26, 2015

(65) Prior Publication Data
US 2016/0197602 A1 Jul. 7, 2016

(30) Foreign Application Priority Data
Aug. 20, 2013 (DE) .......... 10 2013 216 492

(51) Int. Cl.
*H02H 3/027* (2006.01)
*H03K 17/082* (2006.01)
(Continued)

(52) U.S. Cl.
CPC ......... *H03K 17/0822* (2013.01); *H02H 3/202* (2013.01); *H02H 7/0811* (2013.01); *H03K 17/18* (2013.01)

(58) Field of Classification Search
CPC ...... H02H 3/027; H02H 7/0856; H02H 9/042; H02H 9/048; H02H 9/043;
(Continued)

(56) References Cited

U.S. PATENT DOCUMENTS 4,525,765 A * 6/1985 Brajder ............ H03K 17/08126
330/207 P
5,383,083 A * 1/1995 Shinoda .................... H03F 1/52
361/103
(Continued)

FOREIGN PATENT DOCUMENTS

DE 3519791 12/1988
DE 19735543 2/1999
(Continued)

OTHER PUBLICATIONS

German Exam Report for German Application No. 10 2013 216 492.0 dated Jan. 29, 2014.
(Continued)

*Primary Examiner* — Bickey Dhakal
(74) *Attorney, Agent, or Firm* — RatnerPrestia

(57) ABSTRACT

A method for protecting a controllable semiconductor switch from overload and short-circuiting in a load circuit, the method—including detecting an output voltage of the semiconductor switch;—comparing a detected output voltage with a predicted switching progress; and—deactivating the semiconductor switch if the detected output voltage is lower than the predicted switching progress.

12 Claims, 3 Drawing Sheets

(51) Int. Cl.
*H03K 17/18* (2006.01)
*H02H 3/20* (2006.01)
*H02H 7/08* (2006.01)

(58) Field of Classification Search
CPC .... H02J 2007/0039; H02P 1/021; H02P 8/36; H02P 29/027; H02P 29/024; H02P 29/0241
USPC ............ 318/400.21, 434, 400.22; 363/56.03, 363/56.04
See application file for complete search history.

(56) References Cited

U.S. PATENT DOCUMENTS

| | | | |
|---|---|---|---|
| 6,320,405 B1 | 11/2001 | Koelsch | |
| 7,715,160 B2 | 5/2010 | Scheikl et al. | |
| 9,093,836 B2 | 7/2015 | Reiter | |
| 2004/0210349 A1* | 10/2004 | Lenz | H02M 3/33515 700/286 |
| 2004/0218320 A1* | 11/2004 | Strike | H02P 6/26 361/23 |
| 2005/0088216 A1* | 4/2005 | Arndt | H01L 23/62 327/325 |
| 2010/0020450 A1* | 1/2010 | Guillot | H03K 17/166 361/18 |
| 2010/0085675 A1* | 4/2010 | Oki | H02M 1/08 361/101 |
| 2011/0002073 A1* | 1/2011 | Fukuda | H03F 1/523 361/87 |

FOREIGN PATENT DOCUMENTS

| | | |
|---|---|---|
| DE | 10040477 | 3/2002 |
| DE | 102008051074 A1 | 5/2010 |
| DE | 102011003733 | 8/2012 |

OTHER PUBLICATIONS

International Search Report for International Application No. PCT/EP2014/066456 dated Nov. 4, 2014.
Written Opinion of the International Searching Authority for International Application No. PCT/EP2014/066456 dated Nov. 4, 2014.
German Office Action for German Application No. 10 2013 216 492.0, dated Nov. 27, 2017, 5 pages.

* cited by examiner

METHOD FOR PROTECTING A CONTROLLABLE SEMICONDUCTOR SWITCH FROM OVERLOAD AND SHORT-CIRCUITING IN A LOAD CIRCUIT

CROSS REFERENCE TO RELATED APPLICATIONS

This application is the U.S. National Phase Application of PCT International Application No. PCT/EP2014/066456, filed Jul. 31, 2014, which claims priority to German Patent Application No. 10 2013 216 492.0, filed Aug. 20, 2013, the contents of such applications being incorporated by reference herein.

FIELD OF THE INVENTION

The invention relates to a method for the protection of a controllable semiconductor switch against overload and short-circuiting in a load circuit, in particular a method for the protection of semiconductor final stages in the drive of DC motors.

BACKGROUND OF THE INVENTION

DC motors in motor vehicles are usually driven with the aid of relays or of semiconductor switches. These are based on a series circuit comprising a semiconductor switch and a motor as an inductive load, in which the semiconductor switch can be switched on and off by means of control signals from a controller, for example a PWM controller, in other words is controllable.

If a semiconductor switch of this sort is employed in a motor vehicle, both the semiconductor switch and the motor must be protected against short-circuiting and against overload in order to prevent a catastrophic failure.

One approach to this consists in the use of what are known as "intelligent" semiconductor switches wherein, on the basis of measurements of current and/or temperature, the fault state is detected by electronics integrated into the switch, and the semiconductor switch is protected by suitable means. "Intelligent" semiconductor switches of this sort are, however, comparatively expensive, and therefore unacceptable for price-sensitive applications.

Usually, rather, standard power semiconductors, known as power MOSFETs, are used as semiconductor switches, whose protection in the event of a fault is, however, significantly more problematic, since the relevant physical magnitudes of drain current and junction temperature cannot be directly measured.

A further approach consists in connecting a fusible link in series with the controllable semiconductor switch that actuates a load circuit, in particular a motor. This, however, has the crucial disadvantage that fusible links are extremely slow, and that after an overload or a short-circuit has occurred in the load circuit, the fuse is destroyed and must be replaced.

The possibility of limiting the current through appropriate circuitry of the controllable semiconductor switch is also known. It is true that such current limitation prevents an unacceptably high current from flowing through the controllable semiconductor. In the event of an overload or of a short-circuiting in the load circuit, however, a high power loss, which can only be dissipated through suitable large cooling surfaces, occurs at the controllable semiconductor switch. In the majority of cases, however, it is not possible, for reasons of space, to attach a large cooling surface to the switching device. The current limitation circuit is consequently largely only used when only load currents of a few milliamperes occur.

A protection circuit for a controllable semiconductor switch against overload and short-circuiting in a load circuit is known from document DE 35 19 791 C2, which is incorporated by reference, wherein a measuring circuit is provided that is connected both to the load circuit and to a monitoring circuit. The current in the load circuit is here measured, for example by means of the voltage drop across a low-value resistor. If the current exceeds a set limit value, the controllable semiconductor that switches the load circuit is switched off. After a certain time the controllable semiconductor is then switched on again. This creates a measuring current which flows in the load circuit after the controllable semiconductor switch has been switched off, and is evaluated by the measuring circuit. This measuring current is sent through the load circuit until the resistance in the load circuit has reached a rated resistance. On reaching the rated resistance, the monitoring circuit is influenced, at least in respect of removing the switching off of the controllable semiconductor switch, so that it is switched on again.

It has, however, been found disadvantageous with this kind of protective circuit that the measurements cannot be made until the switch is securely fully switched on. If, however, a short-circuit is already present before the power switch is switched on, the semiconductor switch must be operated for a relatively long time in fault operation before the decision regarding deactivation can be made. In addition, in order to avoid incorrect triggering, filtering over time is usually necessary, whereby the time during which the semiconductor switch is operated in fault operation is further extended. As a result of the associated long time remaining in fault operation, the stress on the component is relatively large, and the reliability of the semiconductor switch correspondingly reduced.

SUMMARY OF THE INVENTION

An aspect of the present invention provides a method for the protection of a controllable semiconductor switch against overload and short-circuiting in a load circuit, wherein reaction times of the fault detection can be shortened.

According to one embodiment, a method for the protection of a controllable semiconductor switch against overload and short-circuiting in a load circuit comprises the following steps: an output voltage of the semiconductor switch is detected, a detected output voltage is compared with a predicted switching progress and, if the detected output voltage is smaller than the predicted switching progress, the semiconductor switch is deactivated.

The method is thus based on the knowledge of, or the prediction of, the switching process. The predicted switching progress can in particular be a threshold voltage to be reached that is read from a characteristic curve of the semiconductor switch that gives a predicted curve of the output voltage against time. The basic idea here is, on the basis of this prediction, that of detecting the voltage of the switching process of the semiconductor switch and of comparing it with a target curve.

A method of this sort has the advantage that the reaction times of the fault detection in the protection of a controllable semiconductor switch against overload and short-circuiting in a load circuit can be significantly shortened. Since the method is based here on the knowledge of, or on the prediction of, the switching process, and not on the measurement of the voltage drop in the switched-on state, the method can also be used when the semiconductor switch is not yet fully switched on. This has been found to be advantageous above all when the fault is already present before the semiconductor switch is switched on, and consequently the time until the decision regarding the deactivation of the semiconductor switch in methods that are based on the measurement of the voltage drop in the switched-on state would be particularly long. If it is detected here that the detected output voltage reaches a predicted switching progress, the semiconductor switch remains switched on. If, however, it is detected that the predicted switching progress is not reached, which means that a fault is present, the semiconductor switch is correspondingly deactivated.

Preferably the steps of detecting an output voltage and of comparing the detected output voltage with the predicted switching progress are carried out at least once before the semiconductor switch is fully switched on. The time at which the check is made can here be specified. In this way it is possible to ensure that faults that are already present before the semiconductor switch is switched on, for example that the semiconductor switch when switched on is operated with overload, can also be detected, and the reaction time of the fault detection can thus be significantly shortened, whereby furthermore the stress in the semiconductor switch is minimized.

According to one embodiment, the steps of detecting an output voltage and of comparing the detected output voltage with the predicted switching progress are here performed with at least one repetition. In particular, a decision about aborting the process of switching on, that is to say the deactivation of the semiconductor switch, can thus preferably be carried out a plurality of times before the semiconductor switch is fully switched on. This has the advantage that the precision of the method can be further increased.

It is possible here for the steps of detecting an output voltage and of comparing the detected output voltage with the predicted switching progress to take place at cascaded moments in time. Through the temporal cascading, the decision as to whether the semiconductor switch is deactivated can be made at the earliest possible moment in the switching on of the semiconductor switch, and thus at the moment with the least stress for the semiconductor switch. The significance of cascaded moments in time here is that the individual repetitions are carried out in sequence at suitable time intervals.

The predicted switching progress can, moreover, be freely programmable. This means that a threshold voltage that is to be reached can be adapted flexibly to different switches and/or to different switching-on profiles, whereby the greatest possible flexibility in the drive of the semiconductor switch is achieved.

The method can furthermore also be combined with the known methods for measuring the voltage drop in the switched-on state, in order to ensure the best possible protection of the semiconductor switch with low operational expense. The method can for this purpose in particular comprise the further following steps: a current in a load circuit and/or a voltage drop at the semiconductor switch is/are measured as soon as the semiconductor switch is fully switched on, the measured current and/or the measured voltage drop is/are compared with a specified limit value, and the semiconductor switch is then deactivated if the measured current and/or the measured voltage drop is/are larger than the specified limit value.

With a further embodiment, a protective circuit for a controllable semiconductor switch against overload and short-circuiting in a load circuit is also given, which comprises a monitoring circuit for detecting an output voltage of the semiconductor switch, at least one comparator for comparing the detected output voltage with a predicted switching progress, as well as evaluation logic for deactivating the semiconductor switch if the detected output voltage is smaller than the specified limit value.

A protective circuit of this sort has the advantage that the reaction times of the fault detection when protecting a controllable semiconductor switch against overload and short-circuiting in a load circuit can be significantly shortened. The predicted switching progress here again refers to a threshold voltage to be reached that is read in particular from a characteristic curve of the semiconductor switch that gives a predicted curve of the output voltage against time. Since the protective circuit is designed to base the monitoring of the semiconductor switch on knowledge or prediction of the switching process, and not on the measurement of voltage drops in the switched-on state, the protective circuit can also be used, that means become active, when the semiconductor switch is not yet fully switched on. This has been found to be advantageous above all when the fault is already present before the semiconductor switch is switched on, and consequently the time until the decision regarding the deactivation of the semiconductor switch in protective circuits that are based on the measurement of the voltage drop in the switched-on state would be particularly long. If the protective circuit here detects that the detected output voltage reaches a predicted switching progress, the semiconductor switch remains switched on. If, however, it is detected that the predicted switching progress is not reached, which means that a fault is present, the semiconductor switch is accordingly deactivated.

The evaluation logic can, moreover, be a digital logic circuit. Switching circuits of this sort consist primarily of logic elements such as AND, NAND, OR, NOR, NOT, XOR, XNOR and others, with which digital yes/no information can be combined together, for example in the context of counters or flip-flops. Processors are more complex applications. These too can contain, in addition to logical functions, also time-dependent components and moreover operate under clocked or state control (synchronous/asynchronous). Advantages of digital signal processing over analogue technology are found, in addition to the lower costs of the components due to their high integration density and simplified development, above all in their higher flexibility. With the help of special signal processors or computers, circuits can be implemented in software. Through this, functions can be very quickly adapted to changed requirements. In addition, complex algorithms can be applied easily, which could only be implemented in analogue circuitry with extremely great expense or not at all. These are, furthermore, easy to test, and creeping error propagation is avoided, whereby very complex systems can be implemented, and the loss-free transmission of signals over large distances is enabled.

The control unit can furthermore comprise a microcontroller, comprising a data interface for programming the specified threshold value. "Microcontroller" refers in general to semiconductor chips that contain both a processor and peripheral functions. Modern motor controllers are increasingly also fitted with microcontrollers, in order to process the calculating operations that are required in real time, quickly and accurately. Furthermore, the data interface permits a threshold voltage that is to be reached to be able to be flexibly adapted to different switches or switch-on profiles, whereby the greatest possible flexibility in the operation of the semiconductor switch is achieved. Altogether, the greatest possible flexibility in the operation of the semiconductor switch can thus be achieved, in addition to which the stress in the semiconductor switch can be greatly reduced.

The semiconductor switch can here, in particular, be a power MOSFET. Thus, what are known as standard power semiconductors, which means power MOSFETs, are thus usually used as semiconductor switches. Consequently, by means of a protective circuit of this sort, protection of semiconductor switches used as standard is possible with relatively little drive complexity.

In a further embodiment, a half-bridge circuit is also given for driving a DC motor, which circuit comprises a protective circuit as described above.

Half-bridge circuits are used quite generally for generating an alternating signal from a DC voltage supplied at the input. With appropriate circuitry, half-bridge circuits of this sort can also be used for the generation of multi-phase alternating signals, in particular also of three-phase signals. The alternating signal (which may be multi-phase) at the output is then, for example, supplied to a motor. Half-bridge circuits are here largely based on two power transistors used as semiconductor switches, as well as two diodes which usually are all integrated onto a single chip. A half-bridge circuit of this sort has the advantage that the reaction times for fault detection when protecting a controllable semiconductor switch of the half-bridge circuit against overload and short-circuiting in the motor can be significantly shortened. The predicted switching progress here again refers to a threshold voltage to be reached that is read for example from a characteristic curve of the semiconductor switch that gives a predicted curve of the output voltage against time. Since the protective circuit is designed to base the monitoring of the semiconductor switch on knowledge or prediction of the switching process, and not on the measurement of voltage drops in the switched-on state, the protective circuit can also be used, that means become active, when the semiconductor switch is not yet fully switched on. This has been found to be advantageous above all when the fault is already present before the semiconductor switch is switched on, and consequently the time until the decision regarding the deactivation of the semiconductor switch in protective circuits that are based on the measurement of the voltage drop in the switched-on state would be particularly long. If the protective circuit here detects that the detected output voltage reaches a predicted switching progress, the semiconductor switch remains switched on. If, however, it is detected that the predicted switching progress is not reached, which means that a fault is present, the semiconductor switch is accordingly deactivated.

In summary it can be said that, with the present invention, a method is given for the protection of a controllable semiconductor switch against overload and short-circuiting in a load circuit, with which the reaction times of the fault detection when protecting a controllable semiconductor switch against overload and short-circuiting in a load circuit can be significantly shortened.

The method can thus also be used when the semiconductor switch is not yet fully switched on, since the method is based on knowledge or prediction of the switching process, and not on the measurement of voltage drops in the switched-on state. This has been found to be advantageous above all when the fault is already present before the semiconductor switch is switched on, and consequently the time until the decision regarding the deactivation of the semiconductor switch in protective circuits that are based on the measurement of the voltage drop in the switched-on state would be particularly long.

The flexibility of the method can also be significantly increased, since the predicted switching progress is freely programmable, meaning that a switching profile can thereby be adapted flexibly to different switches.

BRIEF DESCRIPTION OF THE DRAWINGS

The invention is now explained in more detail with reference to the included figures.

FIG. 3 shows a voltage-time diagram of the progress of a method for the protection of a controllable semiconductor switch against overload and short-circuiting in a load circuit according to embodiments of the invention, wherein the semiconductor switch is operated with overload when switched on.

DETAILED DESCRIPTION OF THE PREFERRED EMBODIMENTS

Figure 1:
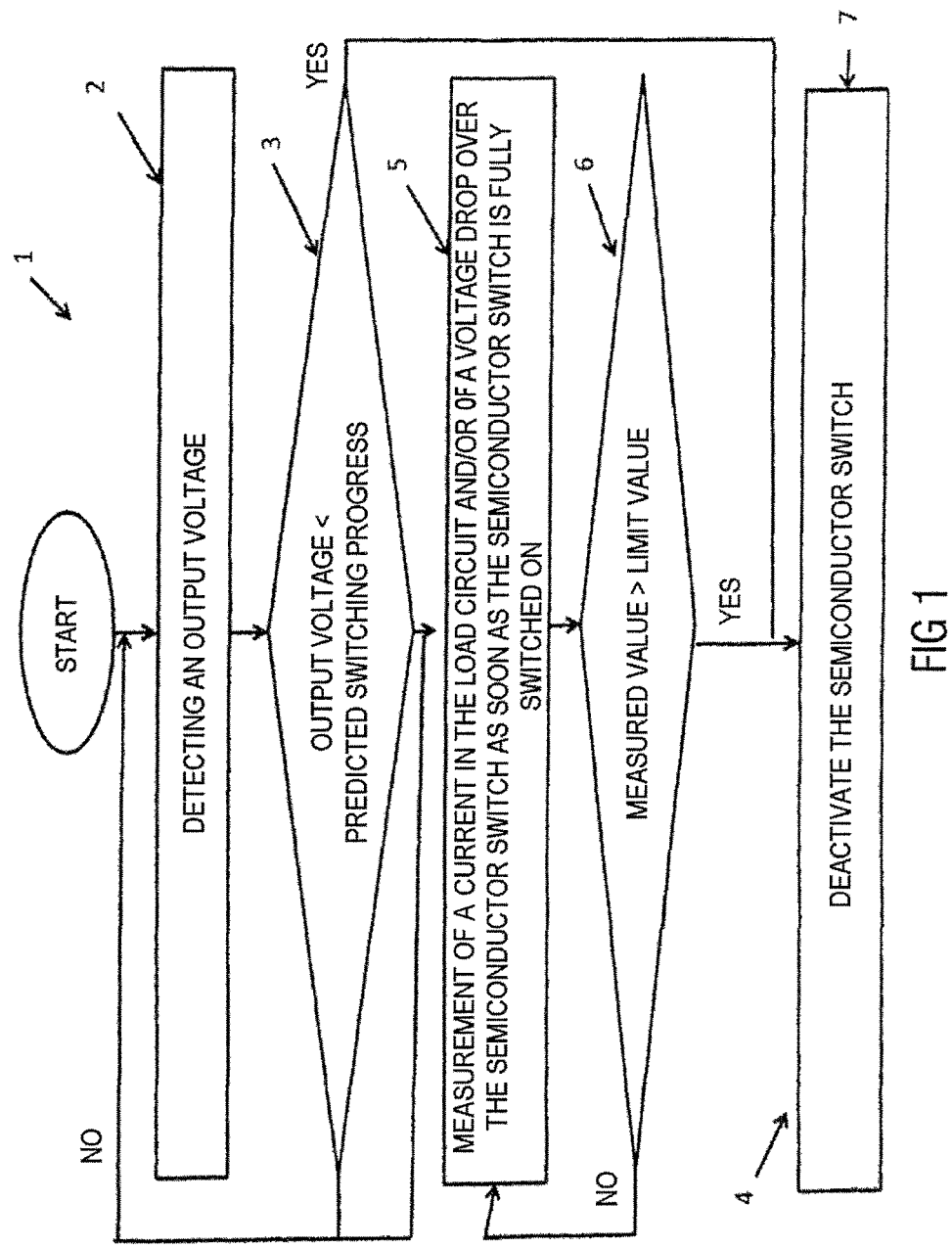
FIG. 1 shows a flow diagram of a method for the protection of a controllable semiconductor switch against overload and short-circuiting in a load circuit according to embodiments of the invention.

FIG. 1 shows a flow diagram of a method 1 for the protection of a controllable semiconductor switch against overload and short-circuiting in a load circuit according to an embodiment of the invention.

As FIG. 1 shows, the method 1 here comprises the following steps: in a step 2 an output voltage of the semiconductor switch is detected, in a step 3 the detected output voltage is compared with a predicted switching progress, and the semiconductor switch is then deactivated in a step 4 if the detected output voltage is smaller than the predicted switching progress. Predicted switching progress here again refers to a threshold voltage to be reached that is read for example from a characteristic curve of the semiconductor switch that gives a predicted curve of the output voltage against time.

Since the method 1 according to FIG. 1 is based on knowledge or prediction of the switching process, and not on the measurement of the voltage drop in the switched-on state, the method can also be used when the semiconductor switch is not yet fully switched on. This has been found to be advantageous above all when the fault is already present before the semiconductor switch is switched on, and consequently the time until the decision regarding the deactivation of the semiconductor switch in methods that are based on the measurement of the voltage drop in the switched-on state would be particularly long.

According to the embodiment of FIG. 1, the steps 2 and 3 of detecting an output voltage of the semiconductor switch and of the comparison of the detected output voltage with the predicted switching progress is carried out at least once before the semiconductor switch is fully switched on.

According to the embodiments of FIG. 1, the method is carried out during a time-window during which the dynamic monitoring of the semiconductor switch is active in such a way that steps 2 and 3 are repeated at least once within this time-window if in a previous check it was detected in step 3 that the output voltage has reached the predicted switching progress.

The repetition or repetitions of steps 2 and 3 is/are carried out here at moments cascaded in time within the time window. Moments cascaded in time here means that the individual steps are carried out in temporal sequence at suitable intervals.

The method 1 as a whole is thus designed to make the decision about the deactivation of the semiconductor switch at the earliest possible moment of switching on, and thus at the moment with the least stress for the semiconductor switch.

As illustrated, the method 1 also comprises the optional step 5 of a measurement of a current in the load circuit and/or of a voltage drop across the semiconductor switch as soon as the semiconductor switch is fully switched on, the step 6 of comparing the measured value with a specified limit value, and the step 7 of deactivating the semiconductor switch if the measured value is larger than the specified limit value. The method 1 can thus be combined with the known methods for measuring the voltage drop in the switched-on state, in order to ensure the best possible protection of the semiconductor switch with low operational complexity, in particular furthermore to be also able to detect reliably errors that are not already present during the switching on process.

Figure 2:
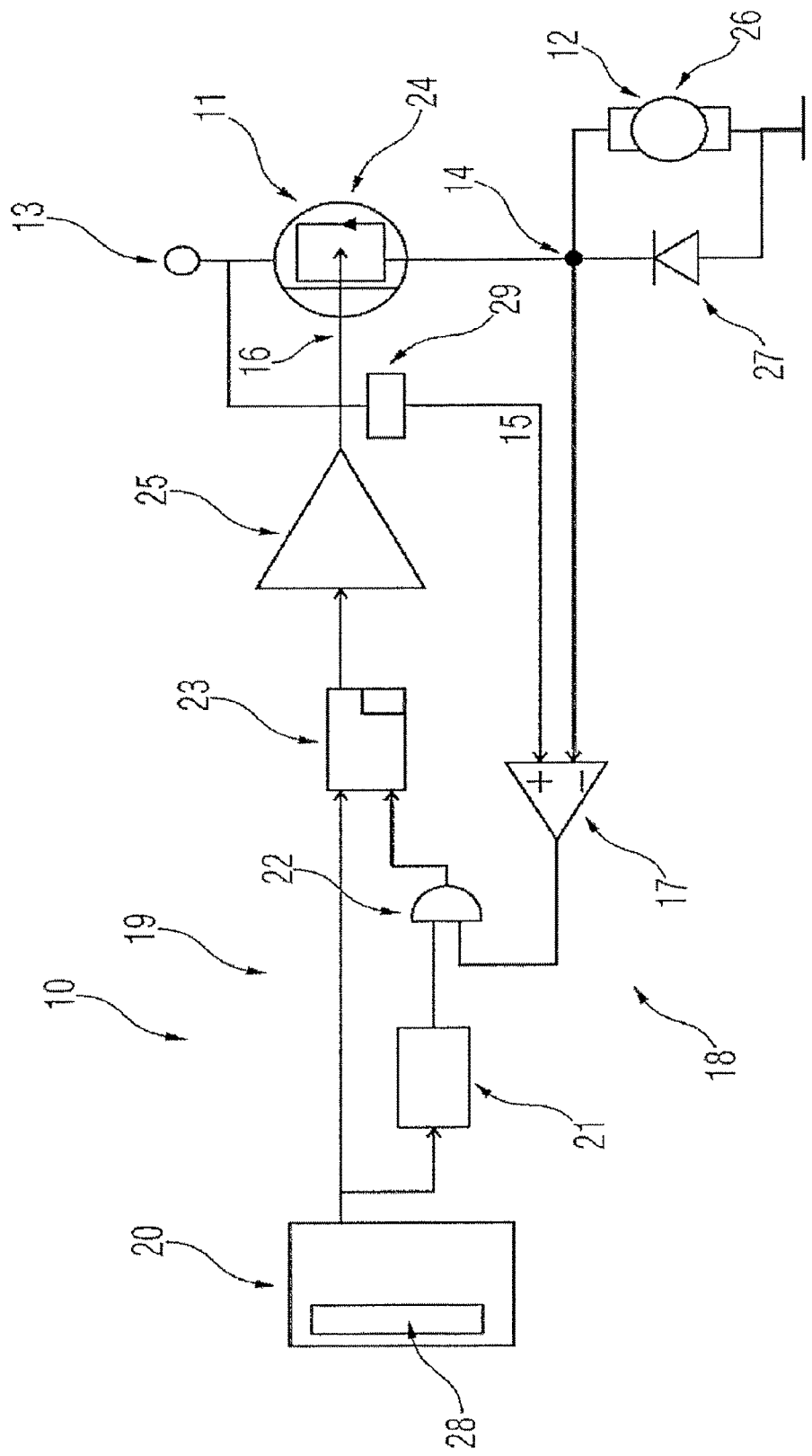
FIG. 2 shows an equivalent circuit diagram of a protective circuit for the protection of a controllable semiconductor switch against overload and short-circuiting in a load circuit according to embodiments of the invention.

FIG. 2 shows an equivalent circuit diagram of a protective circuit 10 for the protection of a controllable semiconductor switch 11 against overload and short-circuiting in a load circuit 12 according to an embodiment of the invention.

FIG. 2 here shows a connecting terminal 13 through which a supply voltage for driving the semiconductor switch is supplied. The actual load circuit 12 is connected at a further terminal 14.

According to the embodiment of FIG. 2, a connecting line 15 is furthermore present from an output 16 of the semiconductor switch 11 to a comparator 17, to convey an output voltage detected or tapped by a monitoring circuit 29 at the input 16 of the semiconductor switch 11. The comparator 17 according to FIG. 2 is furthermore designed to compare the detected output voltage with a predicted switching progress.

FIG. 2 furthermore illustrates evaluation logic 18 implemented as a digital logic circuit 19. This comprises a microcontroller 20, a delay element 21, an AND gate 22 as well as a latch 23. Latch 23 refers in general to a storage element in which the state of the storage element is set by a first control input and reset by a second input.

According to the embodiments of FIG. 2, the latch 23 receives, at its data input, an output signal from the microcontroller 20, in particular a signal to instruct a gate driver 25 to switch the semiconductor switch 13 on or off.

A signal from the AND gate 22, whose input variables are digital information from the control apparatus 21 and from the comparator 17, is present at the second input of the latch 23. The control apparatus 21 is here designed to output digital information relating to one moment of a comparison between the detected output voltage and the predicted switching progress. The AND gate 22 thus has the purpose of linking the digital output signals from the control apparatus 21 and the comparator 17.

If it is now detected that the detected output voltage at the desired moment accords with the predicted switching progress, the output of the AND gate 22 supplies the logical value "0". In this case the state of the latch 23 remains set, and the semiconductor switch 11 thus continues to be driven according to the digital information supplied from the microcontroller 20.

If, conversely, it is detected that the detected output voltage at the desired moment does not accord with the predicted switching progress, the output of the AND gate 22 supplies the logical value "1". In this case, the state of the latch 23 is reset, and the semiconductor switch 13 is thus deactivated.

The microcontroller 20 of FIG. 2 furthermore comprises a data interface 28, by means of which the predicted switching progress is freely programmable.

The semiconductor switch 11 illustrated is a power MOSFET 24, which is driven, in particular switched on, by a gate driver 25.

The load circuit illustrated, moreover, is a DC motor 26. An additional diode 27 can also be seen, whose purpose is to carry the current when idling with low losses.

Figure 3:
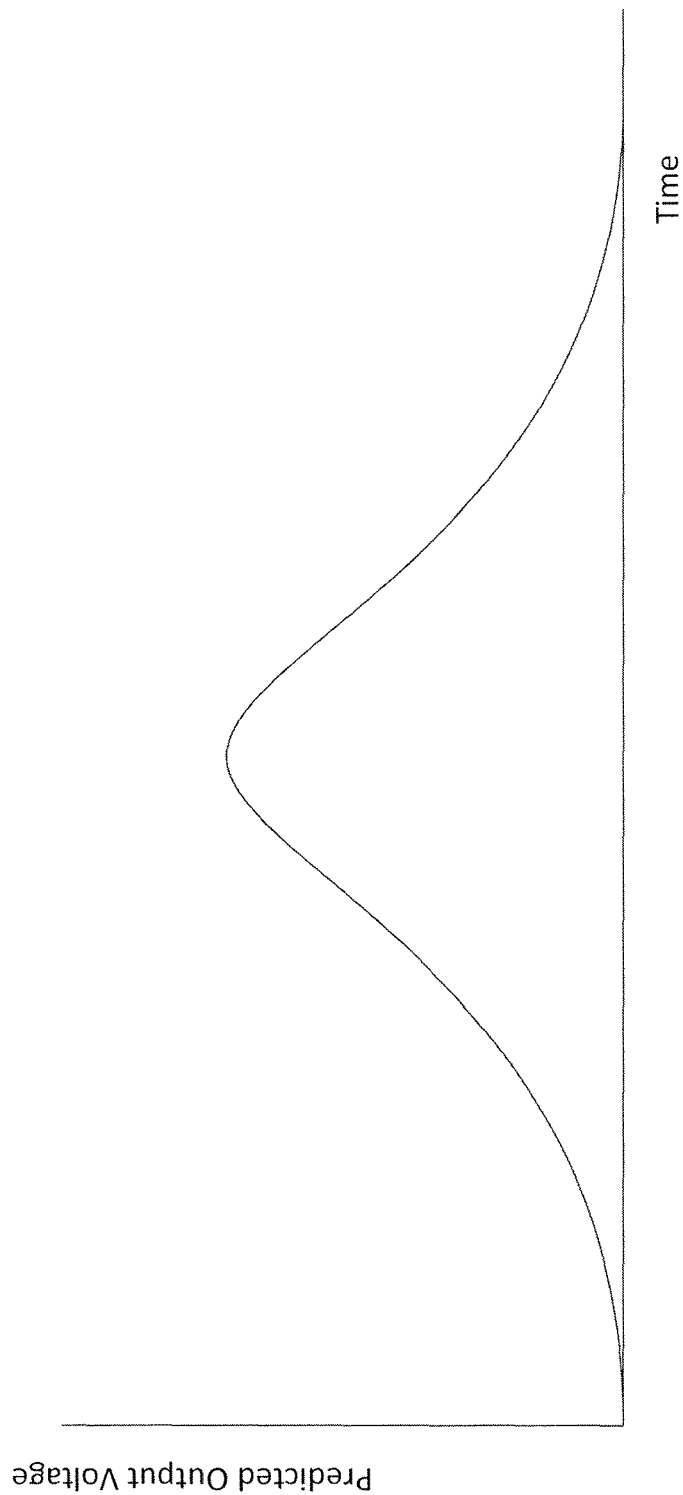

FIG. 3 shows a voltage-time diagram of the course of a method for the protection of a controllable semiconductor switch against overload and short-circuiting in a load circuit according to an embodiment of the invention, wherein the semiconductor switch is operated with an overload when switched on.

FIG. 3 shows the progress over time of a detected output voltage of the semiconductor switch, as well as a predicted switching progress. In the embodiments according to FIG. 3, the detected output voltage is symbolized by the line identified by reference sign 30. The predicted switching progress is, conversely, symbolized by the dotted line identified by reference sign 31.

As can be seen, the semiconductor switch is already operated with an overload when switched on. The detected output voltage of the semiconductor switch at the moment of decision T1 consequently does not reach the specified threshold value U1 of the predicted switching progress. The semiconductor switch is consequently deactivated according to the illustrated embodiments.

LIST OF REFERENCE SIGNS

1 Method
2 Method step
3 Method step
4 Method step
5 Method step
6 Method step
7 Method step
10 Protective circuit
11 Semiconductor switch
12 Load circuit
13 Connecting terminal
14 Further terminal
15 Connecting line
16 Output
17 Comparator
18 Evaluation logic
19 Digital logic circuit
20 Microcontroller
21 Control apparatus
22 AND gate
23 Latch
24 Power MOSFET
25 Gate driver
26 DC motor
27 Diode
28 Data interface
29 Monitoring circuit
30 Output voltage
31 Predicted switching progress

The invention claimed is:

1. A method for the protection of a controllable semiconductor switch against overload and short-circuiting in a load circuit, wherein the method comprises:
   detecting an input voltage of the semiconductor switch;
   detecting an output voltage of the semiconductor switch;
   computing, by a comparator, a difference between the detected output voltage and the detected input voltage;
   comparing, by a comparison circuit including an AND logic gate, the difference to a predicted switching progress computed by a controller that indicates a predicted output voltage at a specified time based on a predetermined characteristic curve of the semiconductor switch;
   triggering, by the controller, a control signal to activate the semiconductor switch in response to the AND logic gate indicating that the difference accords with the predicted switching progress; and
   triggering, by the controller, the control signal to deactivate the semiconductor switch in response to the AND logic gate indicating that the difference does not accord with the predicted switching progress.

2. The method as claimed in claim 1, wherein the detecting the output voltage of the semiconductor switch and comparing the detected output voltage with the predicted switching progress are carried out at least once before the semiconductor switch is fully switched on.

3. The method as claimed in claim 2, wherein the detecting an output voltage and comparing the detected output voltage with the predicted switching progress are repeated at least once.

4. The method as claimed in claim 1, wherein the detecting the output voltage and comparing the detected output voltage with the predicted switching progress are repeated at least once.

5. The method as claimed in claim 4, wherein the detecting the output voltage and comparing the detected output voltage with the predicted switching progress are repeated at cascaded moments in time.

6. The method as claimed in claim 1, wherein the predicted switching progress is freely programmable.

7. The method as claimed in claim 1, wherein the method further comprises:
   measuring a current in the load circuit and/or a voltage drop at the semiconductor switch, as soon as the semiconductor switch is fully switched on;
   comparing the measured current and/or the measured voltage drop with a specified limit value; and
   deactivating the semiconductor switch if the measured current and/or the measured voltage drop is larger than the specified limit value.

8. A protective circuit for a controllable semiconductor switch against overload and short-circuiting in a load circuit, the protective circuit comprising:
   a monitoring circuit for detecting an input voltage of the semiconductor switch and detecting an output voltage of the semiconductor switch;
   at least one comparator for computing a difference between the detected output voltage and the detected input voltage; and
   a controller for:
      comparing, by a comparison circuit including an AND logic gate, the difference to a predicted switching progress that indicates a predicted output voltage at a specified time based on a predetermined characteristic curve of the semiconductor switch,
      triggering a control signal to activate the semiconductor switch in response to the AND logic gate indicating that the difference accords with the predicted switching progress, and
      triggering the control signal to deactivate the semiconductor switch in response to the AND logic gate indicating that the difference does not accord with the predicted switching progress.

9. The protective circuit as claimed in claim 8, further comprising, evaluation logic receiving input from the controller.

10. The protective circuit as claimed in claim 9, wherein the controller is a microcontroller with a data interface for programming the predicted switching progress.

11. The protective circuit as claimed in claim 8, wherein the controller is a microcontroller with a data interface for programming the predicted switching progress.

12. The protective circuit as claimed in claim 8, wherein the semiconductor switch is a power MOSFET.

* * * * *